United States Patent
Oldfield

[11] Patent Number: 5,831,440
[45] Date of Patent: Nov. 3, 1998

[54] SWR BRIDGE CONFIGURATION ENABLING EXTENDED PRECISION AND MEASUREMENT RANGE WHEN MEASURING THROUGH A PRECISION COAX AIRLINE

[75] Inventor: William W. Oldfield, Redwood City, Calif.

[73] Assignee: Wiltron Company, Morgan Hill, Calif.

[21] Appl. No.: 574,230

[22] Filed: Dec. 18, 1995

[51] Int. Cl.$^6$ .................................................. H01R 17/18
[52] U.S. Cl. ........................... 324/637; 439/638; 333/244
[58] Field of Search ................... 324/601, 637, 324/638, 645, 646, 706; 333/244, 260; 439/578

[56] References Cited

U.S. PATENT DOCUMENTS

| | | | |
|---|---|---|---|
| 2,623,122 | 12/1952 | Weber | 324/244 |
| 2,639,317 | 5/1953 | Bennett | 324/646 |
| 2,992,407 | 7/1961 | Slusher | 333/244 |
| 3,249,901 | 5/1966 | Spinner | 333/244 |
| 4,019,162 | 4/1977 | Banning | 333/244 |
| 4,596,435 | 6/1986 | Bickford | 339/177 R |
| 4,816,767 | 3/1989 | Cannon et al. | 324/601 |
| 4,845,423 | 7/1989 | Polland | 324/601 |
| 4,858,160 | 8/1989 | Strid et al. | 324/638 |
| 4,962,359 | 10/1990 | Dunsmore | 324/637 |
| 4,981,445 | 1/1991 | Bacher et al. | 439/578 |
| 5,157,338 | 10/1992 | Motherbaugh et al. | 324/637 |
| 5,167,532 | 12/1992 | Bruno | 439/578 |

*Primary Examiner*—Maura K. Regan
*Attorney, Agent, or Firm*—Fliesler, Dubb, Meyer & Lovejoy

[57] ABSTRACT

A microwave test kit including a SWR bridge with one or more accompanying precision airlines for connecting between the test port of the SWR bridge and a test device. The SWR bridge includes a branch opposite its test port which includes an adapter having a connector with a center conductor support bead matching the center conductor support bead used in the precision airlines to compensate for impedance mismatch. The test kit may further include a standard 50 ohm termination and an offset termination, having an impedance other than 50 ohms, with the adapter of the SWR bridge configured to enable a user to selectively connect the standard termination to enable measurements to be made in an error averaging mode, or the offset termination to enable measurements to be made in a magnified mode.

9 Claims, 4 Drawing Sheets

SWR BRIDGE CONFIGURATION ENABLING EXTENDED PRECISION AND MEASUREMENT RANGE WHEN MEASURING THROUGH A PRECISION COAX AIRLINE

BACKGROUND OF THE INVENTION

1. Field of the Invention

The present invention relates to an SWR bridge, also known as a microwave impedance bridge, or a directional bridge. More particularly, the present invention relates to components used to extend the precision and measurement range when using an SWR bridge to make measurements through a precision coax airline.

2. Description of the Related Art

FIG. 1 shows circuitry for a conventional SWR bridge. As shown, the SWR bridge has a first branch including an impedance element 100 having an impedance value Ra. The first branch element 100 is connected to receive a signal at an RF IN input to the SWR bridge. A second branch includes test port 102 which connects a device under test (DUT) with an arbitrary impedance between the first branch element 100 and ground. A third branch includes an impedance element 104 having an impedance Rb. The third branch element 104 is connected to the RF IN input, similar to element 100. A fourth branch includes an element 106 having a value Rx. The fourth branch element 106 is connected between the third branch element 104 and ground.

An output device 108, which may be a balun or detector, has an impedance Re connected from the connection of elements 100 and 102 to the connection of elements 104 and 106. The output device 108 provides an output signal (OUT) proportional to the voltage difference between the connection of elements 100 and 102 and the connection of elements 104 and 106.

The SWR bridge of FIG. 1 is configured similar to a Wheatstone bridge. With a Wheatstone bridge, to determine the impedance of a DUT connected to test port 102, element 106 would be a variable resistance device, while the values of Ra, Rb and Re would be set to a common value Ro, Ro typically being 50 Ω. The impedance of element 106 would be varied until no voltage difference (or a null point) is measured at the SWR bridge output OUT. At the null point, element 106 and a DUT connected to test port 102 would have an equal impedance.

For microwave impedance measurements, it has been recognized that the voltage measured at the SWR bridge output OUT can be utilized to determine the reflection coefficient, or VSWR of a DUT with the bridge unbalanced, or without a null point being determined. VSWR is simply calculated from the measured voltage from the SWR bridge output with element 106 being a precision reference termination, and with the element 106 as well as elements 100, 104, and 108 having a common impedance value Ro.

Microwave reflection measurements can be made using an SWR bridge in a scaler measurement system as illustrated in block diagram in FIG. 2. As shown, a signal is provided to the RF IN input of the SWR bridge 200 from an RF sweep generator 202 over a range of frequencies. A DUT 204 is connected to the test port of the SWR bridge 200. If the SWR bridge includes a balun, a diode detector 206 is connected to the output of the SWR bridge. The diode detector 206 converts the AC output of the SWR bridge to a DC voltage value. The DC voltage from the diode detector 206 can then be read using a voltage level meter 208. If the SWR bridge includes a diode detector, a direct connection can be made from the SWR bridge output to the voltage level meter 208.

Using an SWR bridge in the scaler mode, measurements are limited by errors due to source match and directivity. Source match errors result when the complex impedance at the test port of the SWR bridge does not match a designed source impedance Zo for the test port. Directivity is leakage voltage due to mechanical or electrical discontinuities, the leakage occurring even with the test port terminated with the impedance Zo.

Three different configurations for measuring return loss are illustrated in FIGS. 3–5 to show how directivity and source match errors, referred to as error vectors of the system, may be factored out when making measurements through a precision coax airline with a scaler system.

FIG. 3 shows a standard measurement configuration, or "standard mode" wherein a DUT is connected directly to the test port of an SWR bridge. FIG. 3A shows a plot of return loss vs. frequency measured from the SWR bridge in a scaler mode using the standard mode of FIG. 3. The plot of FIG. 3A is essentially the sum of the error vectors and return loss vectors from the DUT. As shown, in the standard mode, error vectors are randomly added with DUT vectors making separation of the two vectors difficult.

FIG. 4 shows an SWR bridge with the addition of a precision coax airline 400 separating the SWR bridge and the DUT. FIG. 4A shows a plot of return loss vs. frequency showing data 402 measured from the SWR bridge in a scaler system using the configuration of FIG. 4. In the data 402 of FIG. 4A, the DUT vectors have return loss greater than −20 dB, while the error vectors are approximately −20 dB and appear superimposed on the DUT vectors. To separate the DUT vectors from the error vectors, an error averaging technique may be used to determine the DUT vectors. In the error averaging technique, an average is determined from measurement 402 as shown by line 404 to eliminate the error vectors. The DUT vectors are then represented by the average line 404. The measurement configuration for measuring using the error averaging technique is called the "error averaging mode."

The error averaging technique enables accurate reflection measurements to about −20 dB return loss. In the error averaging mode, measurements are restricted to a DUT having return loss vectors above a −20 dB limit because as the error vectors and the DUT vectors become close to equal in value, determination of which is the error vector and which is the DUT vector becomes more difficult. The error vector is approximately −20 dBs due mainly to directivity resulting from a support bead in the precision airline.

FIG. 5 shows an SWR bridge connected to a DUT through a precision coax airline, but with a reference termination at a different value other than a standard termination, which is typically 50 ohms, as in FIG. 4. Typically in the configuration of FIG. 5 the reference termination value will be either 40 ohms or 60 ohms. The reference termination being altered from 50 ohms when the precision coax airline is terminated in 50 ohms will give a reflection display of approximately −20 dB. The SWR bridge reference termination having a value other than the standard termination is called an "offset termination". The measurement configuration of FIG. 5 is called the "magnified mode".

The magnified mode of FIG. 5 allows measurement of very small reflections with the error vector being larger than the DUT vector. The typical range of return loss measured using the magnified method of FIG. 5 is about −30 dB to −50 dB. FIG. 5A shows a plot of return loss vs. frequency measured from the SWR bridge in a scaler system using the configuration of FIG. 5. The plot of FIG. 5A includes an error vector of approximately −20 dB with a DUT vector superimposed on the −20 dB error vector. The DUT vector can, thus, be determined as the superimposed ripple minus the −20 dB offset error vector. Measurements are restricted to below −30 dB because with the DUT vectors approaching the error vectors, determination of which is the DUT vector and which is the error vector becomes more difficult.

Thus, although a precision coax airline enables more accurate measurements in a scaler system than without the precision airline, there is a gap between −20 dB and −30 dB return loss that cannot be measured using the precision airline.

SUMMARY OF THE INVENTION

The present invention provides an SWR bridge which allows more accurate reflection measurements over a larger signal range when utilized with a precision coax airline in a scaler system than prior art configurations. With the present invention, performance may be extended so that the measurement ranges in the error averaging and magnified modes overlap.

The present invention further provides a single SWR bridge which may be used for measurements in the error averaging mode, or the magnified mode.

The present invention is a microwave test kit including an SWR bridge configured similar to the SWR bridge of FIG. 1 with the impedance of branch element 106 set to compensate for an impedance of a first connector of a precision airline connectable to the SWR bridge test port. To compensate for impedance of the first connector, the branch element 106 includes an adapter having a center conductor support bead set to match the center conductor support bead of the first connector. With compensation for mismatch due to the support bead of a precision airline, the −20 dB to −30 dB gap between the error averaging mode and magnified mode can be bridged, and measurement accuracy can be increased in a standard mode.

The test kit of the present invention may further include a standard 50 ohm termination and an offset termination, having an impedance other than 50 ohms, with the adapter of the SWR bridge and SWR bridge housing configured to enable a user to selectively connect the standard termination, or the offset termination. Measurements may, thus, be selectively made in the error averaging mode, or in the magnified mode with a single SWR bridge.

BRIEF DESCRIPTION OF THE DRAWINGS

Further details of the present invention are explained with the help of the attached drawings in which:

FIGS. 3A–5A show plots of return loss vs. frequency measured from an SWR bridge in a scaler mode using the configurations of respective FIGS. 3–5;

DETAILED DESCRIPTION

The present invention includes an SWR bridge with one or more precision airlines for connecting between the test port of the SWR bridge and a test device. To compensate for the mismatch of a particular precision airline, the present invention utilizes a compensating impedance on the branch of the SWR bridge opposite the test port connector.

Figure 1:
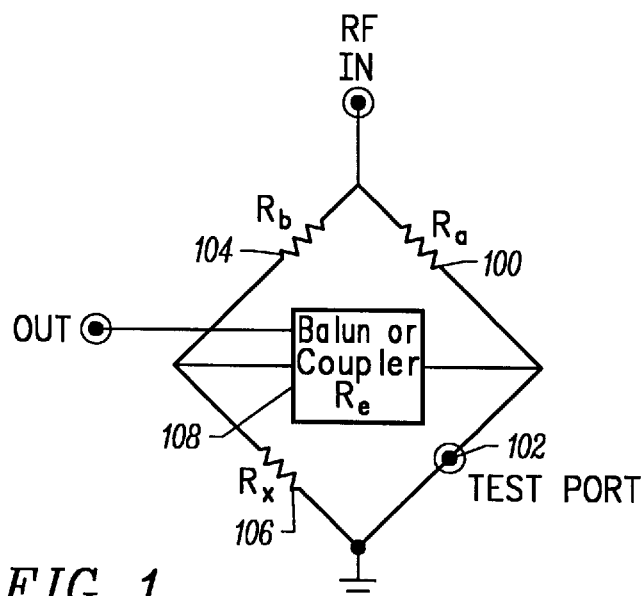
FIG. 1 shows circuitry for a conventional SWR bridge.
Figure 2:
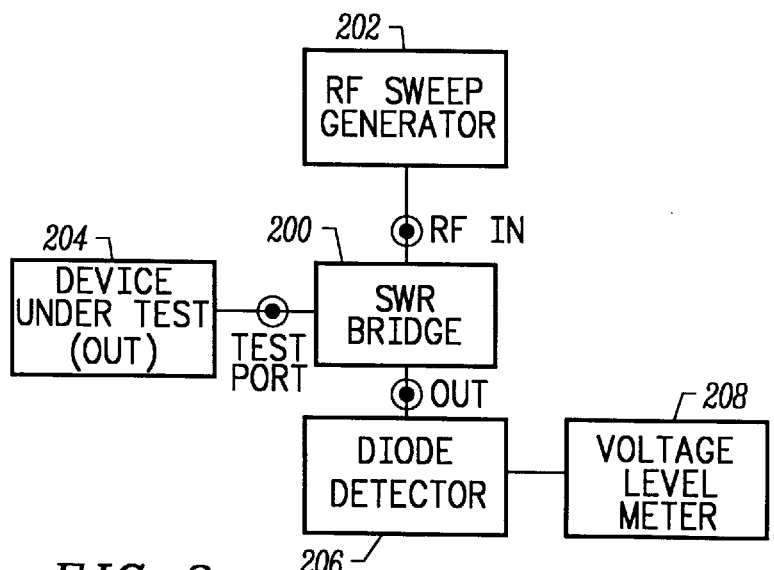
FIG. 2 shows a block diagram of a scaler measurement system.
Figure 3:
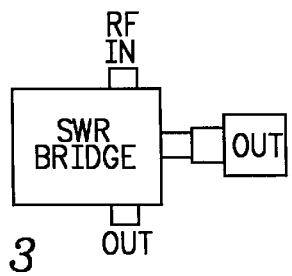
FIGS. 3–5 show different device configurations for measuring return loss.
Figure 3A:
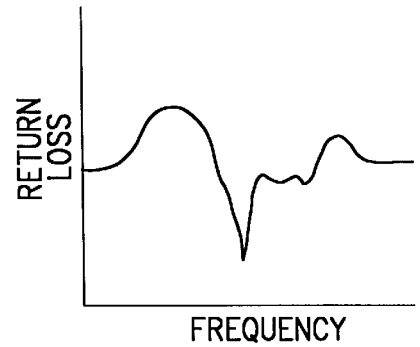
Figure 4:
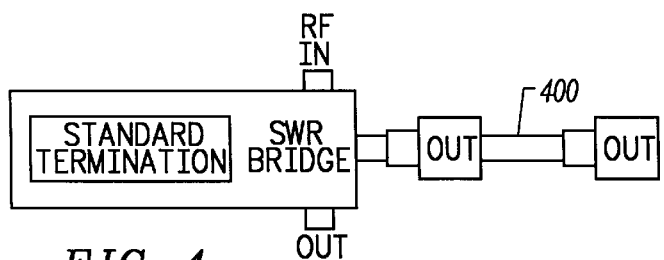
Figure 4A:
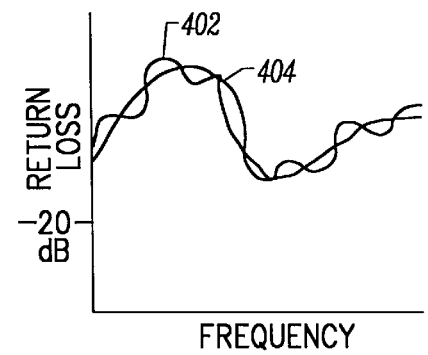
Figure 5:
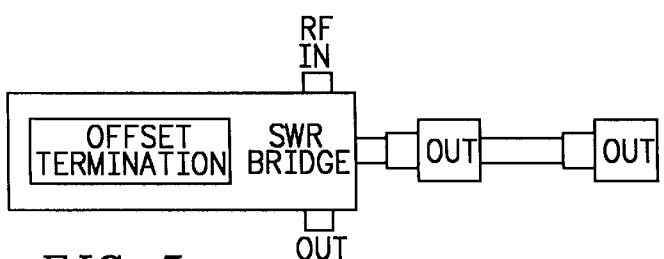
Figure 5A:
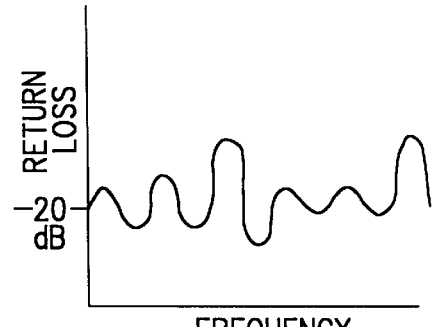
Figure 6:
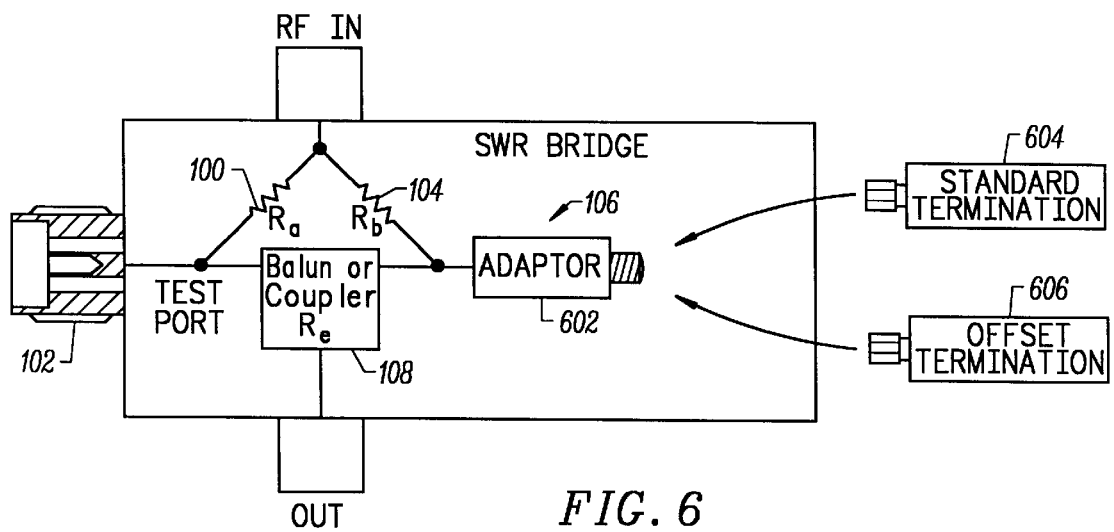
FIG. 6 shows an embodiment of an SWR bridge of the present invention.

FIG. 6 shows an embodiment of an SWR bridge of the present invention with internal components illustrating how compensation is provided for a precision airline. As shown, the SWR bridge includes internal impedance elements 100, 104 and 106, test port 102 and balun or coupler 108 similar to those of FIG. 1. For the present invention, as shown in FIG. 6, element 106 includes an adapter 602 connected in series with one of termination impedances 604 and 606. The adapter 602 includes a connector having components similar to connectors of precision airlines which connect to the test port 102 of the SWR bridge. Further details of such an adapter 602 can be found in U.S. patent application Ser. No. 08/504,964, entitled "Connector Saving Adapters and SWR bridge Configuration Allowing Multiple Connector Types To Be Used With A Single SWR Bridge, filed Jul. 20, 1995, and incorporated herein by reference.

Figure 7:
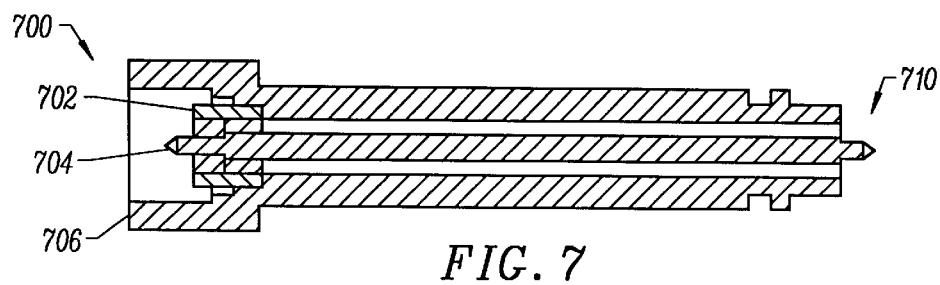
FIG. 7 shows the cross section of a precision airline of the present invention.

FIG. 7 shows the cross section of a precision airline of the present invention. The precision airline of FIG. 7 has a first male connector 700 for connecting to the female test port connector 102 shown in FIG. 6, and a second male connector 710 for connecting to a connector of a DUT. Although connector 700 is shown as a male connector and connector 102 is shown as a female connector, the sex of these connectors may be interchanged. Similarly, although connector 710 is shown as male, it may also be configured as a female connector.

Figure 8:
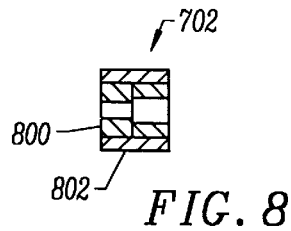
FIG. 8 shows a cross section of the support bead of FIG. 7.

Connector 700 of FIG. 7 includes a support bead 702 shown in cross section in FIG. 8. The support bead includes a center dielectric portion 800 which supports the center conductor 704 of the precision airline of FIG. 7 in a metal barrel 802 which is captured by the outer conductor 706 of the precision airline. The support bead 702 captures the center conductor 704 at a point where the center conductor 704 changes diameter.

With the support bead 702 capturing the center conductor 704 at a point where it changes diameters, a slight mismatch will occur. Further, because of gaps between the support bead 702 and the outer conductor, a mismatch can occur. In fact, a large part of the −20 dB to −30 dB gap which is unusable between the error averaging mode and the magnified mode is accounted for by the mismatches generated by the support bead, such as 702. The support bead 702 has the effect of reducing directivity when using the SWR bridge in the error averaging configuration to prevent accurate measurements below −20 dB. Further, the support bead mismatch causes some ripple in the −20 dB offset value in the magnified configuration.

To compensate for mismatches caused by the support bead, the adapter 602 of FIG. 6 specifically includes a connector having a support bead substantially matching to the support bead 702. In particular, the support bead of the precision airline and the adapter have substantially identical outer diameters, center bore diameters and total lengths, and capture center conductor pin portions having substantially identical diameters. With compensation for the degrading effect of the precision airline support bead, the −20 dB to −30 dB gap between the error averaging and magnified modes can be bridged. For example, in the error averaging mode configuration return loss measurements can be made as low as −30 dB.

As indicated in the background, typically SWR bridges are made in either a standard version, having a standard termination or with an offset termination version to enable measurements to be made in a magnified mode. The adapter 602 includes a connector, and the SWR bridge housing is configured to allow a user to selectively connect either the standard termination 604, having an impedance value such as 50 ohms, or an offset termination 606 having an impedance other than the standard termination 606, such as 40 or 60 ohms, to the adapter 602. The present invention, thus, provides a single SWR bridge which may be used to make measurements in an error averaging or in a magnified mode.

The single SWR bridge and precision airline provided in a microwave test kit of the present invention, as described above, enable a connection to a group of connector types which may be provided on a DUT which are mechanically compatible. The precision airline includes a first connector which is mechanically connectable to the test port of the SWR bridge and a second connector which is also mechanically connectable to the test port of the SWR bridge to avoid source match errors.

The test kit of the present invention may further include a second precision airline having a first connector mechanically compatible with the first connector of the first precision airline, but a second connector which is not mechanically compatible. The second precision airline enables a single SWR bridge to be matched to a second group of connectors which mechanically mate, but which do not mechanically mate with a connector of the first precision airline. Like the first precision airline, the second precision airline further includes a support bead mechanically matching the support bead 602 of the adapter of the SWR bridge provided in the test kit of the present invention.

Examples of a first group of connectors typically used in microwave measurements which mechanically mate include 3.5 mm, SMA and 2.92 m connectors. A second group of connectors which mechanically mate, but not with the first group, include 2.5 mm and 1.85 mm connectors.

Figure 9:
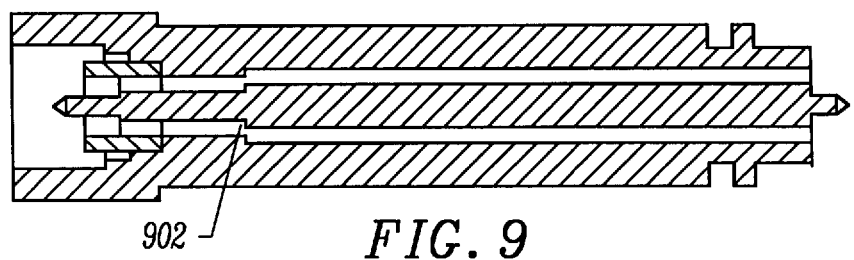
FIG. 9 shows a precision airline with an additional step interface as compared to the precision airline of FIG. 7.

With the second precision airline adapting two mechanically incompatible connectors, the second precision airline will include an impedance mismatch which significantly increases source match errors as compared to the first precision airline. To avoid such source match errors, the second precision airline of the present invention is further configured to include a step interface 902, as illustrated in FIG. 9, rather than a uniform bore diameter, as in FIG. 7, to provide compensation for the impedance mismatch. Note that although the step interface 902 provides a step up to a larger connector portion, a transition may step down to a smaller connector portion.

In addition to the precision airlines and single SWR bridge, a microwave test kit of the present invention may include multiple adapters which connect the SWR bridge to DUTs with different connector types to make measurements in the standard mode. The configuration of such adapters is described in U.S. patent application Ser. No. 08/504,964, referenced previously.

Although the invention has been described above with particularity, this was merely to teach one of ordinary skill in the art how to make and use the invention. Many modifications will fall within the scope of the invention, as that scope is defined by the following claims.

What is claimed is:

1. A microwave test kit comprising:
    a first precision airline including a first connector having a support bead; and
    an SWR bridge including a plurality of interconnected branches comprising:
        a first branch including a test port connector which mechanically mates with the first connector of the first precision airline; and
        a second branch element which includes an adapter having a support bead substantially matching the support bead of the first precision airline.

2. The microwave test kit of claim 1 further comprising:
    a standard termination having an impedance Ro which is connectable to the adapter; and
    an offset termination having an impedance value other than Ro which is connectable to the adapter.

3. The microwave test kit of claim 1 wherein the first precision airline further includes a second connector which mechanically mates the test port connector, and the microwave test kit further comprises:
    a second precision airline including a support bead matching the support bead of the adapter, the second precision airline having a first connector which mechanically mates with the test port connector and a second connector which does not mechanically mate with the test port connector, the second precision airline having an additional step interface in comparison with the first precision air line.

4. The microwave test kit of claim 3 wherein the second connector of the first precision airline mechanically mates with 3.5 mm, SMA and 2.92 mm connectors, while the second connector of the second precision airline mechanically mates with 2.5 mm and 1.85 mm connectors.

5. The microwave test kit of claim 3 wherein the second connector of the first precision airline mechanically mates with 2.5 mm and 1.85 mm connectors, while the second connector of the second precision airline mechanically mates with 3.5 mm, SMA and 2.92 mm connectors.

6. The microwave test kit of claim 1, wherein the SWR bridge receives an RF input signal, and wherein the branches of the SWR bridge further comprise:
    a third branch element having an impedance Ro connected in series with the first branch element, the third branch element being connected to receive the RF input signal;
    a fourth branch element having the impedance Ro connected in series with the second branch element, the fourth branch element being connected to receive the RF input signal; and
    a balun having a first terminal connected between the first and third branch elements and a second terminal connected between the second and fourth branch elements, the coupling means providing the impedance Ro between its first and second terminals.

7. The microwave test kit of claim 6 wherein the impedance Ro is approximately 50 ohms.

8. The microwave test kit of claim 1, wherein the SWR bridge receives an RF input signal, and wherein the branches of the SWR bridge further comprise:

a third branch element having an impedance Ro connected in series with the first branch element, the third branch element being connected to receive the RF input signal;

a fourth branch element having the impedance Ro connected in series with the second branch element, the fourth branch element being connected to receive the RF input signal; and a detector having a first terminal connected between the first and third branch elements and a second terminal connected between the second and fourth branch elements, the coupling means providing the impedance Ro between its first and second terminals.

9. The microwave test kit of claim 8 wherein the impedance Ro is approximately 50 ohms.

* * * * *